(12) United States Patent
Merchant et al.

(10) Patent No.: US 8,068,371 B2
(45) Date of Patent: Nov. 29, 2011

(54) METHODS AND SYSTEMS TO IMPROVE WRITE RESPONSE TIMES OF MEMORY CELLS

(75) Inventors: Feroze A. Merchant, Austin, TX (US); John Reginald Riley, Austin, TX (US); Vinod Sannareddy, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 307 days.

(21) Appl. No.: 12/347,979

(22) Filed: Dec. 31, 2008

(65) Prior Publication Data

US 2010/0165756 A1    Jul. 1, 2010

(51) Int. Cl.
*G11C 7/10*  (2006.01)
(52) U.S. Cl. ......... 365/189.04; 365/189.14; 365/189.08; 365/196; 365/100; 365/148
(58) Field of Classification Search .............. 365/189.04, 365/189.14, 189.08, 196, 100, 148
See application file for complete search history.

(56) References Cited

U.S. PATENT DOCUMENTS 6,956,421 B1 * 10/2005 Schuelein ..................... 327/201

* cited by examiner

*Primary Examiner* — Thong Q Le
(74) *Attorney, Agent, or Firm* — Garrett IP, LLC

(57) ABSTRACT

Methods and systems to dynamically control state-retention strengths of a plurality of memory cells during a write operation to a subset of the memory cells. Dynamic control may include weakening state-retention strengths of the plurality of memory cells during a write operation to a subset of the memory cells, while preserving state-retention abilities of remaining ones of the plurality of memory cells. Weakening may include adjusting one or more resistances between one or more power supplies and the plurality of memory cells. Dynamic control may be selectively performed on portions of each of the memory cells in response to an input data logic state. Dynamic control may reduce a write contention within the subset of memory cells without disabling state-retention abilities of remaining ones of the plurality of memory cells, and may improve write response times of the memory cells.

20 Claims, 7 Drawing Sheets

METHODS AND SYSTEMS TO IMPROVE WRITE RESPONSE TIMES OF MEMORY CELLS

BACKGROUND

A memory system may include a plurality of memory cells having a common data input. Each memory cell may include first and second storage nodes, a first pass transistor to write a logic state from the common data input to the first storage node, and a second pass transistor to write an opposite sense of the logic state to the second storage node. Each memory cell may include first and second inverters opposingly coupled between the first and second storage nodes to maintain opposite-sense logic states at the first and second storage nodes.

When a logic state is written to the first or second storage node, over an opposite-sense of the logic state, a write-contention in one or both of the inverters may delay completion of the write operation. Write contention may be overcome by using larger pass transistors, which may consume more area and power.

BRIEF DESCRIPTION OF THE DRAWINGS/FIGURES

Figure 1:
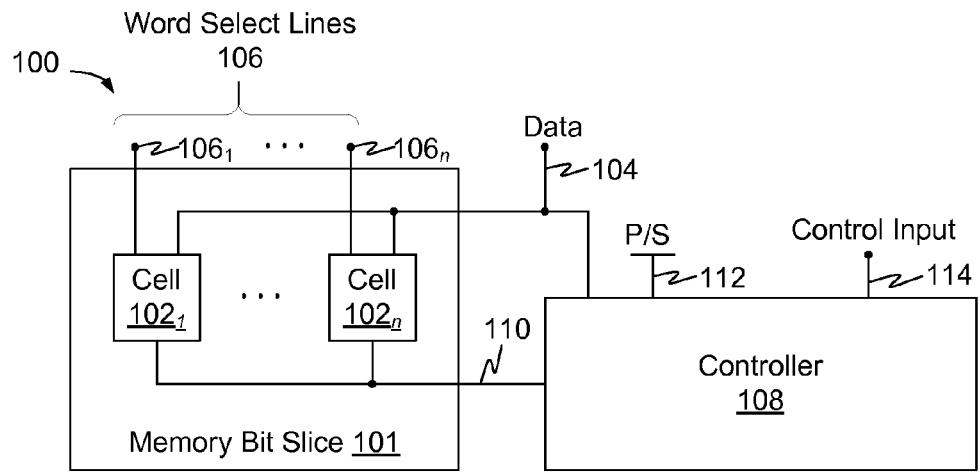
FIG. 1 is a block diagram of an exemplary memory system including a plurality of memory cells and a controller to dynamically control write retention strengths of the plurality of memory cells during a write operation to a subset of the memory cells.

In the drawings, the leftmost digit(s) of a reference number identifies the drawing in which the reference number first appears.

DETAILED DESCRIPTION

Disclosed herein are methods and systems to dynamically control state-retention strengths of a plurality of memory cells during a write operation to a subset of the memory cells. Dynamic control may include weakening state-retention strengths of the plurality of memory cells while preserving state-retention abilities of remaining ones of the plurality of memory cells. The dynamic control of state-retention strengths may reduce a write contention within the subset of memory cells, and may improve write response times of the memory cells.

FIG. 1 is a block diagram of an exemplary memory system 100 including a plurality of memory cells 102, illustrated here as memory cells $102_1$ through $102_n$, which may form a bit slice 101 of an array of memory cells. A data input line or node 104 is common to memory cells $102_1$ through $102_n$. Word select lines 106 control writing of data from node 104 to individual ones of memory cells 102.

Memory system 100 includes a controller 108 to dynamically control state-retention strengths of memory cells 102 during a write to a subset of one or more of memory cells 102. Controller 108 may be configured to weaken state-retention strengths of memory cells 102 during a write to a subset of memory cells 102, while preserving or without substantially compromising or disabling state-retention abilities of remaining memory cells 102. The weakening of the state-retention strengths may reduce a write contention within the subset of memory cells, and may improve write response times.

Controller 108 may include one or more output nodes 110 and may be configured to control one or more resistances between one or more power supplies and the one or more output nodes 110. Controller 108 may be configured to control the one or more resistances in response to logic states written to memory cells 102.

Controller 108 may be configured to receive input data at node 104, one or more supply voltages and/or currents at one or more corresponding source nodes, illustrated here as a power supply (P/S) node 112, and one or more control signals at one or more corresponding control inputs, illustrated here as a control input 114.

Figure 2:
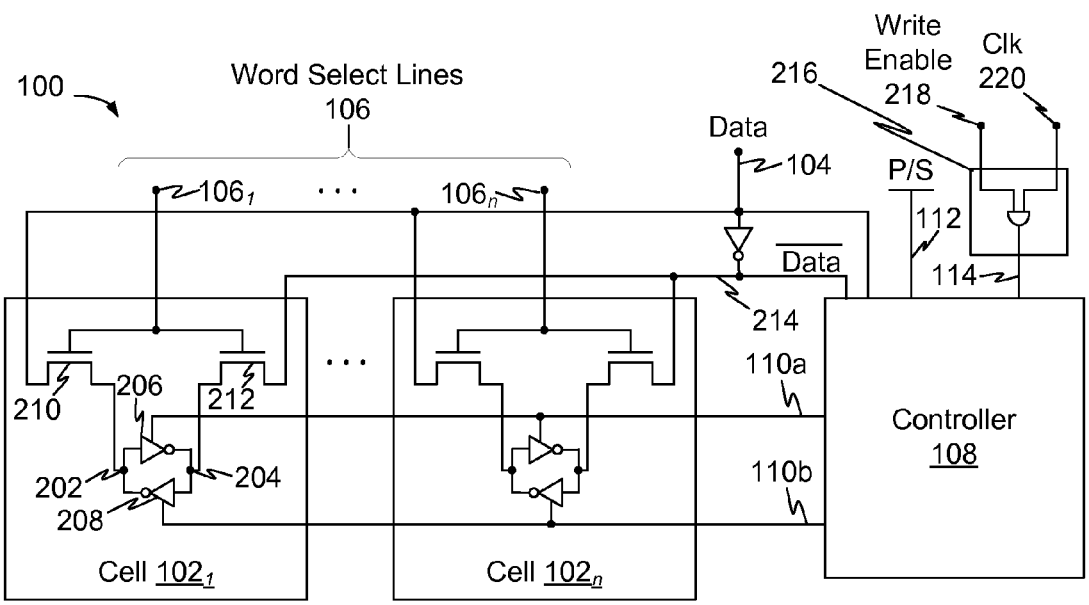
FIG. 2 is another block diagram of the memory system of FIG. 1.

FIG. 2 is a block diagram of memory system 100, wherein memory cell $102_1$ includes first and second opposite sense storage nodes 202 and 204, respectively, and first and second inverters 206 and 208, respectively. Inverters 206 and 208 are opposingly coupled between first and second opposite sense storage nodes 202 and 204 to maintain opposite-sense logic states at first and second storage nodes 202 and 204.

Memory cells $102_2$ through $102_n$ may be configured substantially similar to memory cell $102_1$.

During a write operation, a logic state from data input node 104 is applied to first storage node 202 through a first input circuit 210, and an opposite-sense of the logic state is applied from an inverted data input node 214 to second storage node 204, through a second input circuit 212, under control of a word select input $106_1$. Inverters 206 and 208 serve to enforce and maintain opposite sense logic states at storage nodes 202 and 204 until different logic states are applied to storage nodes 202 and 204.

Input circuits 210 and 212 may include one or more of n-type devices, p-type devices, other types of devices, and combinations thereof. In the example of FIG. 2, input circuits 210 and 212 include n-type field effect transistors (n-FETs).

For convention, where a write operation includes applying a logic state of 1 to first storage node 202 from data input node 104, and applying a corresponding logic state of 0 to second storage node 204 from inverted data input node 214, the write operation is referred to herein as a write of a logic state of 1 to the corresponding memory cell 102. Conversely, where a write operation includes applying a logic state of 0 to first storage node 202 from data input node 104, and applying a corresponding logic state of 1 to second storage node 204 from inverted data input node 214, the write operation is referred to herein as a write of a logic state of 0 to the corresponding memory cell 102.

Controller 108 may be configured to selectively weaken inverters 206, inverters 208, or inverters 206 and 208, or portions thereof, in all of memory cells $102_1$ through $102_n$ during a write operation to a subset of memory cells 102. This may reduce contention at the inverters, such as when a logic state is written over a pre-existing opposite-sense of the logic state, and may improve write response times.

In the example of FIG. 2, controller 108 includes first and second output nodes 110a and 110b to control write retention strengths of inverters 206 and 208, respectively. Controller 108 may be configured to control resistances between one or more power supply nodes 112 and first and second output nodes 110a and 110b.

Figure 3:
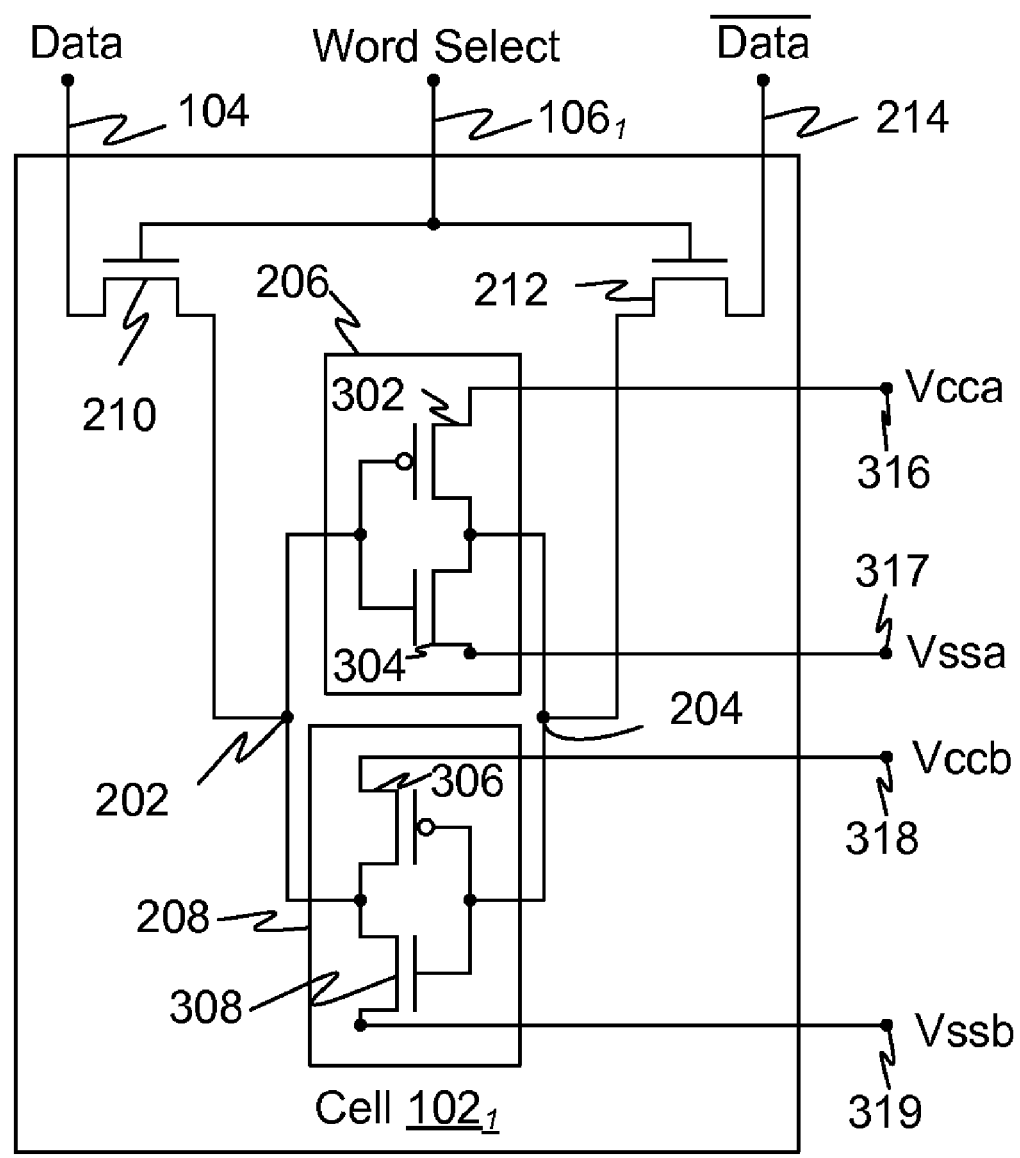
FIG. 3 is an exemplary circuit diagram of a memory cell.

FIG. 3 is an exemplary circuit diagram of memory cell $102_1$, wherein inverter 206 includes a p-type device 302 and an n-type device 304, and inverter 208 includes a p-type device 306 and an n-type device 308.

When a logic state of 1 is applied to first storage node 202, p-type device 302 turns off to substantially isolate second storage node 204 from a voltage Vcca at a node 316, and n-type device 304 turns on to couple second storage node 204 to a ground or Vssa voltage at a node 317. As a corresponding opposite-sense logic state of 0 is applied to second storage node 204, p-type device 306 turns on to couple first storage node 202 to a voltage Vccb at a node 318, and n-type device 308 turn off to substantially isolate first storage node 202 from a ground or Vssb voltage at a node 319.

Where input circuits 210 and 212 include n-type devices, as in the example of FIG. 2, the strength of the logic state 1 applied to first storage node 202 may be weaker than a strength of the logic state 0 applied to second storage node 204. Where the logic states are to be written over preexisting opposite senses of the logic states, and where Vcca and Vccb are substantially equal to one another, a relatively weak logic state of 1 applied to input node 202 may result in a slower turn-off of p-type device 302 and/or turn-on of n-type device 304, compared to a corresponding turn-on of p-type device 306 and turn-off of n-type device 308. As a result, a write response for the logic state of 1 through inverter 206 may be slower than a write response for the logic state of 0 through inverter 208. Similarly, when a logic state of 1 is applied to second storage node 204 and a corresponding opposite-sense logic state of 0 is applied to first storage node 202, a write response for the logic state of 1 through inverter 208 may be slower than a write response for the logic state of 0 through inverter 206.

Conversely, where input circuits 210 and 212 include p-type devices, the strength of a logic state 0 applied by one of input circuits 210 and 212 may be weaker than the strength of a corresponding opposite-sense logic state 1 applied by the other one of input circuits 210 and 212. As a result, a write response for the logic state of 0 through a corresponding one of inverters 206 and 208 may be slower than a write response for the corresponding logic state of 1 through the other one of inverters 206 and 208.

Controller 108 may be configured to weaken one or more of p-type devices 302, n-type devices 304, p-type devices 306, and n-type devices 308, in all of memory cells 102, when a logic state to be written to a subset of memory cells 102 will result in the corresponding device being turned off. This may result in faster turn-offs of the corresponding device(s), which may reduce a corresponding write time, without disabling state-retention abilities of remaining memory cells 102.

For example, where a logic state of 1 is written to first storage node 202 and a logic state of 0 is written to second storage node 204, p-type device 302 and n-type device 308 turn off. Controller 108 may be configured to weaken one or both of p-type device 302 and n-type device 308 in this situation. This may reduce a contention current in the corresponding devices, and may improve write response times.

Similarly, where a logic state of 0 is written to first storage node 202 and a logic state of 1 is written to second storage node 204, n-type device 304 and p-type device 306 turn off. Controller 108 may be configured to weaken one or both of n-type device 304 and p-type device 306 in this situation. This may reduce a contention current in the corresponding devices, and may improve write response times.

Controller 108 may be configured to weaken p-type devices 302 in memory cells 102 in response to a logic state of 1 to be written to one or more first storage nodes 202, and to weaken p-type devices 306 in memory cells 102 in response to a logic state of 1 written to one or more second storage nodes 204.

Figure 4:
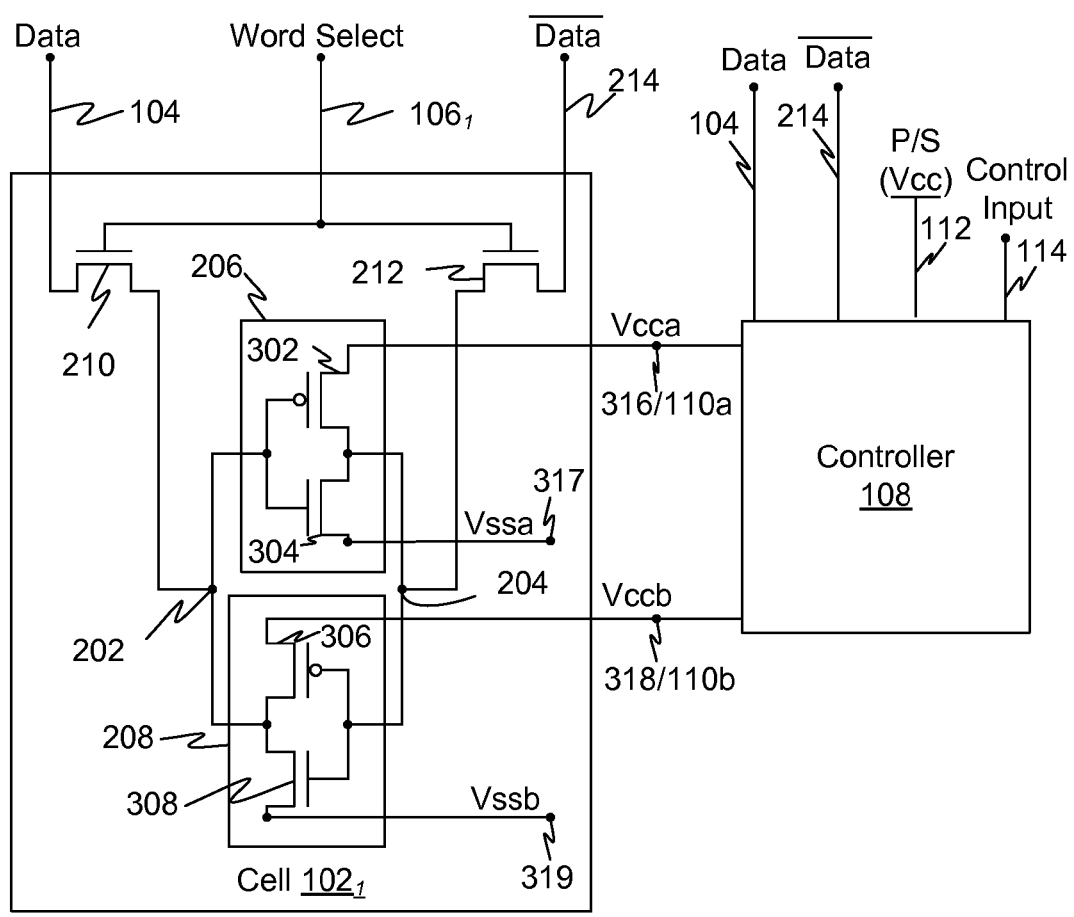
FIG. 4 is an exemplary circuit diagram of the memory cell coupled to a controller.

For example, FIG. 4 is an exemplary circuit diagram of memory cell $102_1$ coupled to controller 108, wherein Vcca node 316 and Vccb node 318 are coupled to controller output nodes 110a and 110b, respectively, and power supply node 112 may be coupled to a relatively high voltage source, illustrated here as Vcc. Controller 108 may be configured to increase a resistance between controller output node 110a/Vcca node 316 and power supply node 112 when a logic state of 1 is applied to storage node 202, and to increase a resistance between controller output node 110b/Vccb node 318 and power supply node 112 when a logic state of 1 is written to storage node 204.

Controller 108, as illustrated in FIG. 4, may be configured to control resistances between power supply node 112 and output nodes 110a and 110b in accordance with Table 1, below, where an "X" indicates a "do not care" value.

TABLE 1

| Control Input 114 | Data Input 104 | Output 110a | Output 110b |
|---|---|---|---|
| 0 | X | Low R | Low R |
| 0 | X | Low R | Low R |
| 1 | 0 | Low R | Increased R |
| 1 | 1 | Increased R | Low R |

Alternatively, or additionally, controller 108 may be configured to weaken n-type devices 304 in memory cells 102 in response to a logic state of 0 to be written to one or more first storage nodes 202, and to weaken n-type devices 308 in memory cells 102 in response to a logic state of 0 to be written to one or more second storage nodes 204.

Figure 5:
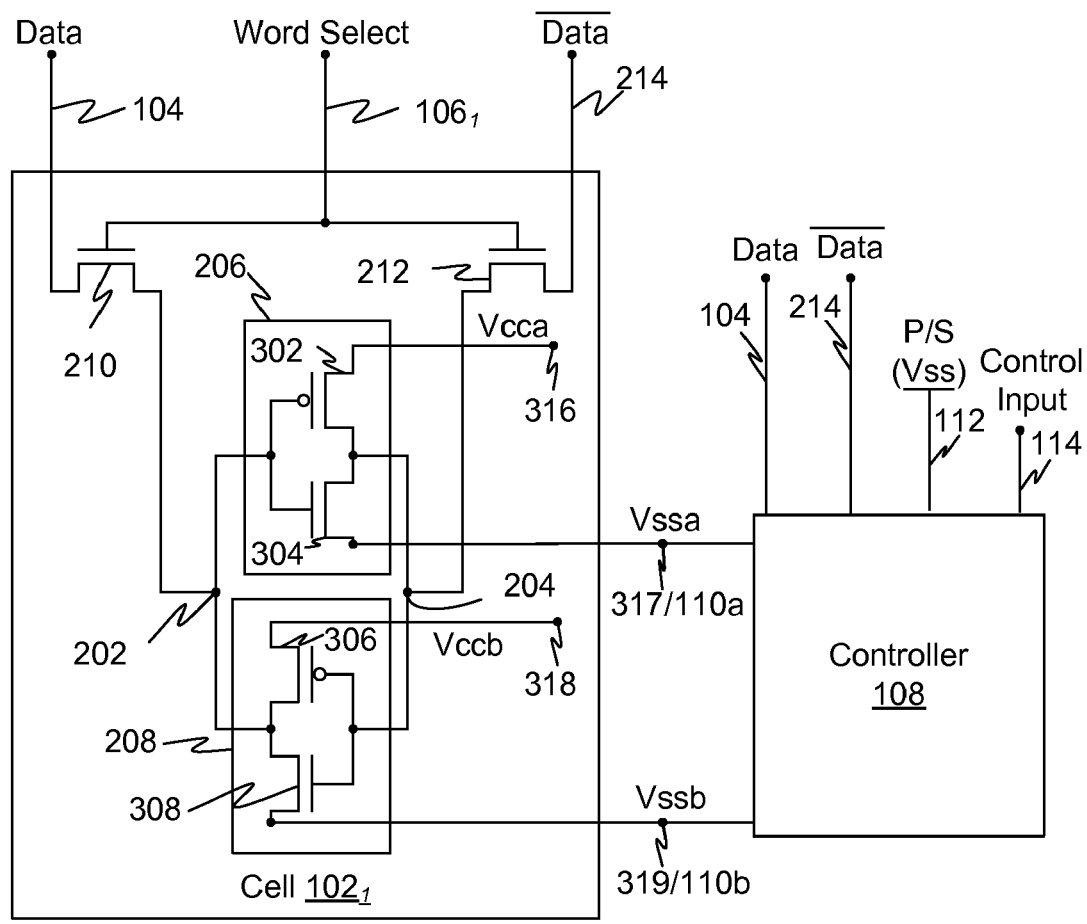
FIG. 5 is another exemplary circuit diagram of the memory cell coupled to the controller.

FIG. 5 is an exemplary circuit diagram of memory cell $102_1$ coupled to controller 108, wherein Vssa node 317 and Vssb node 319 are be coupled to controller output nodes 110a and 110b, respectively, and power supply node 112 may be coupled to a relatively low voltage source, illustrated here as Vss. Controller 108 may be configured to increase a resistance between controller output node 110a/Vssa node 317 and power supply node 112 when a logic state of 0 is written to one or more first storage nodes 202, and to increase a resistance between controller output node 110b/Vssb node 319 and power supply node 112 when a logic state of 0 is written to one or more second storage nodes 204.

Controller 108, as illustrated in FIG. 5, may be configured to control resistances between power supply node 112 and output nodes 110a and 110b in accordance with Table 2, below, where an "X" indicates a "do not care" value.

TABLE 2

| Control Input 114 | Data Input 104 | Output 110a | Output 110b |
|---|---|---|---|
| 0 | X | Low R | Low R |
| 0 | X | Low R | Low R |

TABLE 2-continued

| Control Input 114 | Data Input 104 | Output 110a | Output 110b |
|---|---|---|---|
| 1 | 0 | Increased R | Low R |
| 1 | 1 | Low R | Increased R |

Figure 6:
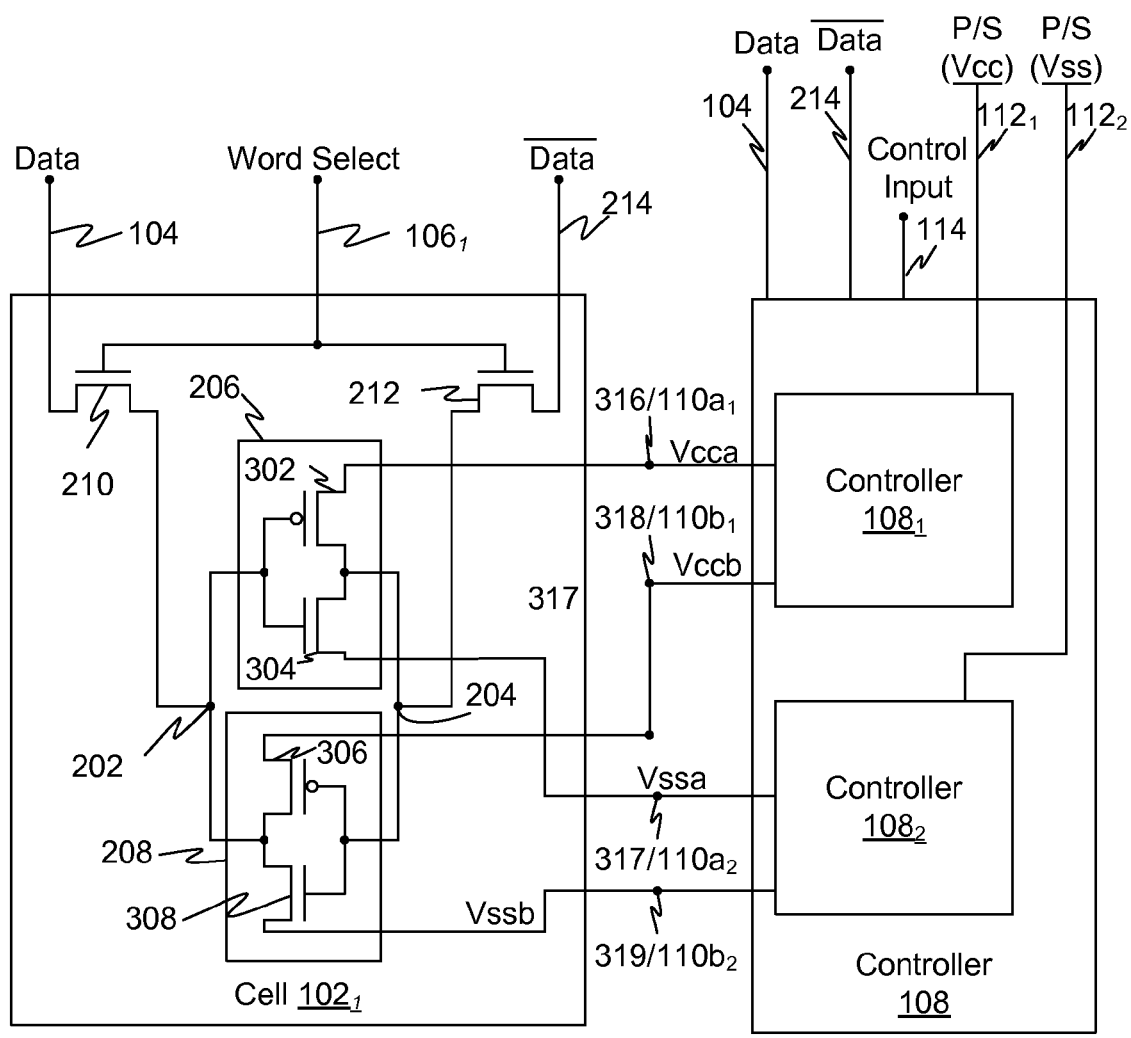
FIG. 6 is another exemplary circuit diagram of the memory cell coupled to the controller.

Controller 108 may be configured to implement logic of Tables 1 and 2. FIG. 6 is an exemplary circuit diagram of memory cell $102_1$ coupled to controller 108, wherein controller 108 includes a first controller $108_1$, corresponding to controller 108 of FIG. 4, and a second controller $108_2$, corresponding to controller 108 of FIG. 5.

First controller $108_1$ includes outputs $110a_1$ and $110b_1$, coupled to Vcca and Vccb nodes 316 and 318, respectively. First controller $108_1$ is configured to receive a relatively high voltage supply, illustrated here as Vcc, at a power supply node $112_1$, and to control resistances between power supply node $112_1$ and outputs $110a_1$ and $110b_1$ substantially as described above with respect to FIG. 4.

Second controller $108_2$ is configured to receive a relatively low voltage supply, illustrated here as Vss, at a power supply node $112_2$. Second controller $108_2$ includes outputs $110a_2$ and $110b_2$, coupled to Vssa and Vssb nodes 317 and 319, respectively, and to control resistances between power supply node $112_2$ and outputs $110a_2$ and $110b_2$ substantially as described above with respect to FIG. 5.

Figure 7:
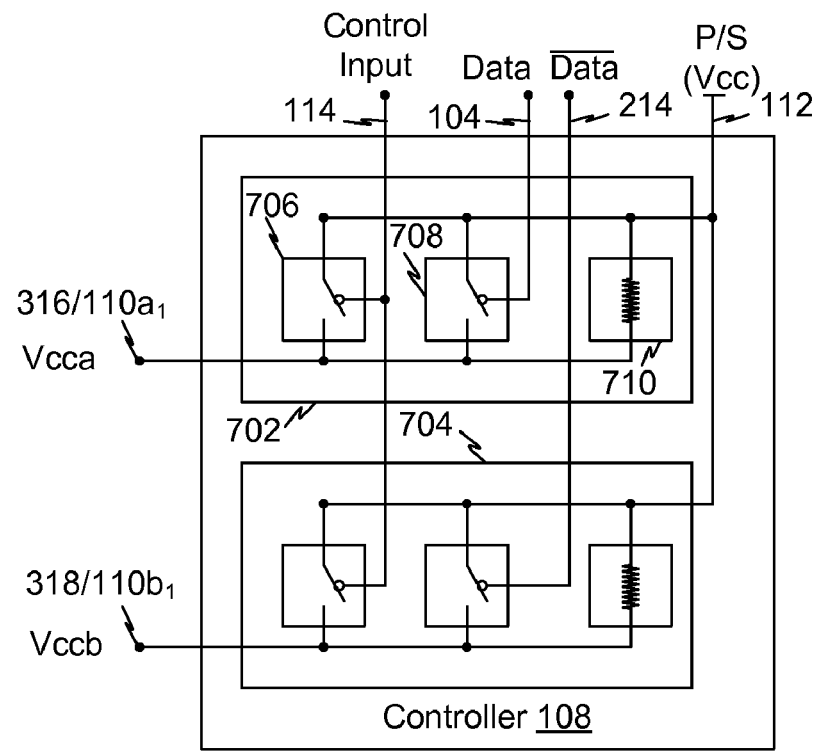
FIG. 7 is an exemplary circuit diagram of the controller.

FIG. 7 is an exemplary circuit diagram of controller 108 configured to implement one or more of logic of Table 1, controller 108 in FIG. 4, and controller $108_1$ in FIG. 6. In the example of FIG. 7, controller 108 includes first and second control portions 702 and 704, to control corresponding resistances between power supply node 112 and output nodes 110a and 110b, in response to logic states at input data node 104 and inverted input data node 214. Power supply node 112 may be coupled to a relatively high voltage source, illustrated here as Vcc.

Control portion 702 includes a first switch device 706 to couple power supply node 112 to output node 110a during inactive states of a control signal at control input 114, corresponding to no active write operations with respect to memory cells 102.

The control signal at control input 114 may correspond to a write enable signal ANDed with a clock signal, as illustrated in FIG. 2, and first switch device 706 may be controlled to couple power supply node 112 to output node 110a during inactive phases of the write enable signal.

Control portion 702 includes a second switch device 708 to selectively couple power supply node 112 to output node 110a in response to a logic state of 0 at input data node 104.

First and second switch devices 706 and 708, together, serve to couple power supply node 112 to output node 110a except during an active clock phase of a write operation of a logic state of 1 to first storage node 202 of one or more memory cells 102.

Control portion 702 further includes a resistor 710 to provide a relatively weak path between power supply node 112 and output node 110a when first and second switch devices 706 and 708 are open, or during an active clock phase of a write operation of a logic state of 1 to first storage node 202 of one or more memory cells 102.

Control portion 704 may be configured similar to control portion 702, with respect to inverted input data node 214 and output node 110b.

In the example of FIG. 7, switch devices 706 and 708 are illustrated as active-low devices. Alternatively, one or more of switch devices 706 and 708 may be implemented as, or include active-high devices.

Figure 8:
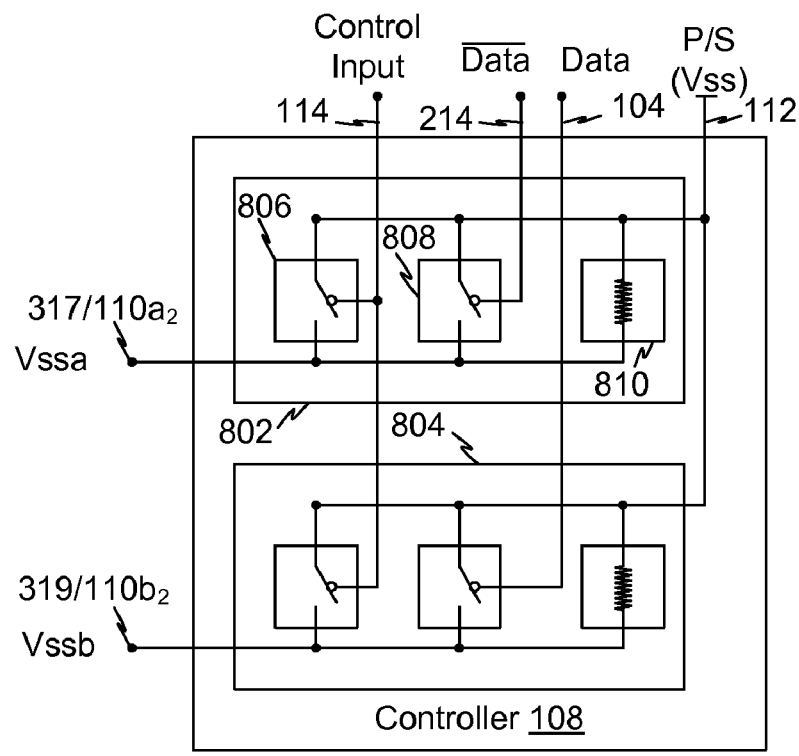
FIG. 8 is another exemplary circuit diagram of the controller.

FIG. 8 is an exemplary circuit diagram of controller 108 configured to implement one or more of logic of Table 2, controller 108 in FIG. 5, and controller $108_2$ in FIG. 6. In the example of FIG. 8, controller 108 includes first and second control portions 802 and 804, to control corresponding resistances between power supply node 112 and output nodes 110a and 110b, in response to logic states at input data node 104 and inverted input data node 214. Power supply node 112 may be coupled to a relatively low voltage source, illustrated here as Vss.

Control portion 802 includes a first switch device 806 to couple power supply node 112 to output node 110a during inactive states of a control signal at control input 114, corresponding to no active write operations with respect to memory cells 102.

The control signal at control input 114 may correspond to a write enable signal ANDed with a clock signal, as illustrated in FIG. 2, and first switch device 806 may be controlled to couple power supply node 112 to output node 110a during inactive phases of the write enable signal. Alternatively, where word select lines 106 are clocked with clock 220, word select lines 106 may be applied to inputs of OR logic, an output of which may be applied to control input 114.

Control portion 802 includes a second switch device 808 to selectively couple power supply node 112 to output node 110a in response to a logic state of 0 at inverted data input node 214, corresponding to a logic state of 1 at input data node 104.

First and second switch devices 806 and 808, together, serve to couple power supply node 112 to output node 110a except during an active clock phase of a write operation of a logic state of 0 to first storage node 202 of one or more memory cells 102.

Control portion 802 further includes a resistor 810 to provide a relatively weak path between power supply node 112 and output node 110a when first and second switch devices 806 and 808 are open, or during an active clock phase of a write operation of a logic state of 0 to first storage node 202 of one or more memory cells 102.

Control portion 804 may be configured similar to control portion 802, with respect to input data node 104 and output node 110b.

In the example of FIG. 8, switch devices 806 and 808 are illustrated as active-low devices. Alternatively, one or more of switch devices 806 and 808 may be implemented as, or include active-high devices.

Controller 108 may be configured increase a resistance by an amount sufficient to improve write response times of the subset of memory cells 102 while preserving or without disabling state-retention abilities of remaining memory cells 102. A resistance may be increased to reduce a current to a minimum current necessary to retain state-retention abilities of memory cells 102, which may be process and/or implementation dependent.

Figure 9:
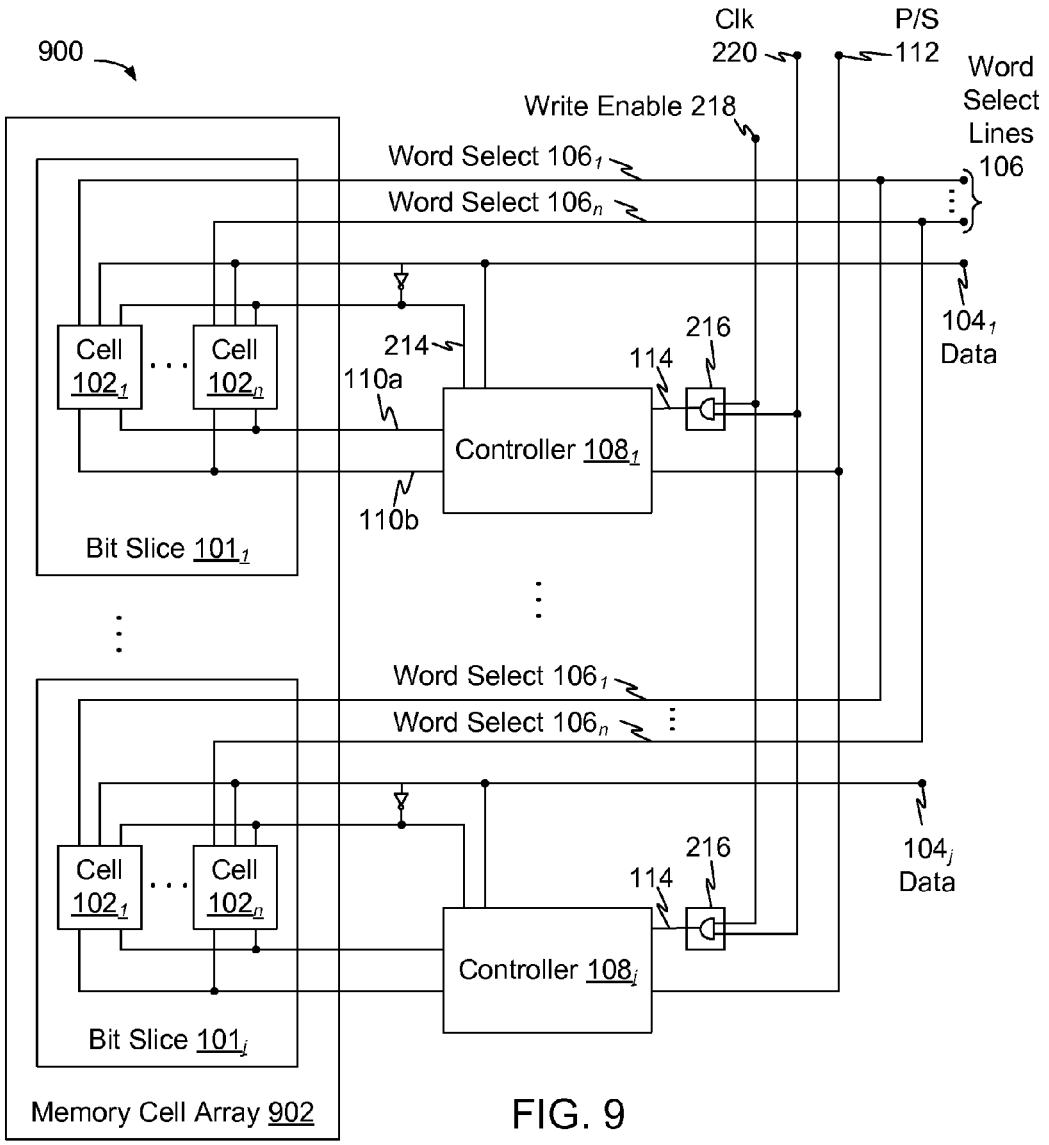
FIG. 9 is an exemplary block diagram of another memory system including an array of memory cells configured as a plurality of bit slices, and a corresponding plurality of controllers.

FIG. 9 is a block diagram of an exemplary memory system 900 including an array 902 of memory cells configured as a plurality of bit slices $101_1$ through $101_j$, each including a corresponding plurality of memory cells $102_1$ through $102_n$.

Bit slices $101_1$ through $101_j$ each include a corresponding data input 104 that is common to memory cells of the bit slice. Word select lines 106 may be common to all or a subset of bit slices $101_1$ through $101_j$.

Bit slices $101_1$ through $101_j$ each include a corresponding controller 108 to dynamically control state-retention strengths of the memory cells of the corresponding bit slices, as described in one or more examples herein. Controllers 108 may be configured to receive one or more power sources at one or more corresponding power supply nodes 112.

Figure 10:
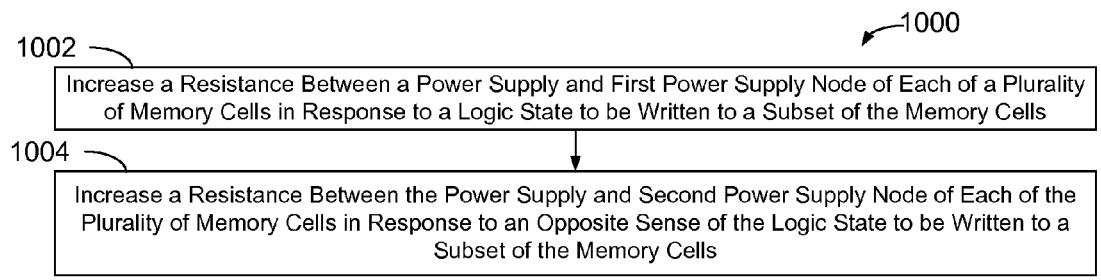
FIG. 10 is a process flowchart of an exemplary method of controlling write retention strengths of a plurality of memory cells during a write operation to a subset of the memory cells.

FIG. 10 is a process flowchart of an exemplary method 1000 of dynamically controlling strengths of a plurality of memory cells during a write operation to a subset of the memory cells.

At 1002, a resistance is increased between a power supply and a first power supply node of each of a plurality of memory cells in response to a logic state to be written to a subset of the memory cells.

At 1004, a resistance is increased between the power supply and a second power supply node of each of the plurality of memory cells in response to an opposite sense of the logic state to be written to a subset of the memory cells.

Method 1000 may be implemented in accordance with one or more exemplary block diagrams and/or circuit diagrams herein. Method 1000 is not, however, limited to the exemplary block diagrams or circuit diagrams herein.

One or more features disclosed herein may be implemented with discrete and integrated circuit logic, including application specific integrated circuit (ASIC) logic, and may be implemented as part of an integrated circuit package or a combination of integrated circuit packages.

Methods and systems are disclosed herein with the aid of functional building blocks illustrating exemplary functions, features, and relationships thereof. At least some of the boundaries of these functional building blocks have been arbitrarily defined herein for the convenience of the description. Alternate boundaries may be defined so long as the specified functions and relationships thereof are appropriately performed.

What is claimed is:

1. A system, comprising:
    a plurality of memory cells having a common data input; and
    a control circuit to weaken state-retention strengths of the plurality of memory cells during a write operation to a subset of the memory cells, and to preserve state-retention abilities of remaining ones of the plurality of memory cells during the write operation.

2. The system of claim 1, wherein each of the plurality of memory cells includes first and second opposite-sense storage nodes to store corresponding opposite-sense logic states, and first and second inverters opposingly coupled between the first and second opposite-sense storage nodes, and wherein the control circuit includes:
    first circuitry to weaken state-retention strengths of the first inverters of the plurality of memory cells during a write of a logic state to one or more of the first storage nodes, in response to the logic state; and
    second circuitry to weaken state retention strengths of the second inverters of the plurality of memory cells during a write of the logic state to one or more of the second storage nodes, in response to the logic state.

3. The system of claim 2, wherein:
    the first circuitry includes circuitry to increase a resistance between a power supply and the first inverters of the plurality of memory cells during a write of the logic state to the one or more first storage nodes; and
    the second circuitry includes circuitry to increase a resistance between the power supply and the second inverters of the plurality of memory cells during a write of the logic state to the one or more second storage nodes.

4. The system of claim 3, wherein the control circuit includes a power supply node, the common data input, an inverted data input, a control input, a first output node coupled to the first inverter circuits of the plurality of memory cells, and a second output node coupled to the second inverter circuits of the plurality of memory cells, and wherein:
    the first circuitry includes,
        a first resistor coupled between the power supply node and the first output node,
        a first switch circuit to couple the power supply node to the first output node in response to an inactive write enable state at the control input, and
        a second switch circuit to couple the power supply node to the first output node in response to the logic state at one of the common data input and the inverted data input; and
    the second circuitry includes,
        a second resistor coupled between the power supply node and the second output node,
        a third switch circuit to couple the power supply node to the second output node in response to an inactive write enable state at the control input, and
        a fourth switch circuit to couple the power supply node to the second output node in response to the logic state at the other one of the common data input and the inverted data input.

5. The system of claim 4, wherein:
    the first inverters each include a p-type device having a gate coupled to the corresponding first storage node, and source and drains each coupled to a corresponding one of the control circuit first output node and the second storage node; and
    the second inverters each include a p-type device having a gate coupled to the corresponding second storage node, and source and drains each coupled to a corresponding one of the control circuit second output node and the first storage node.

6. The system of claim 4, wherein:
    the first inverters each include an n-type device having a gate coupled to the corresponding first storage node, and source and drains each coupled to a corresponding one of the control circuit first output node and the second storage node; and
    the second inverters each include an n-type device having a gate coupled to the corresponding second storage node, and source and drains each coupled to a corresponding one of the control circuit second output node and the first storage node.

7. The system of claim 1, wherein each of the plurality of memory cells includes first and second opposite-sense storage nodes to store corresponding opposite-sense logic states, and first and second inverters opposingly coupled between the first and second opposite-sense storage nodes, wherein each of the inverters includes first and second power supply nodes, and wherein the control circuit includes:
    first circuitry to increase a resistance between a first power supply and the first power supply nodes of the first inverters during a write of a logic state to one or more of the first storage nodes;
    second circuitry to increase a resistance between a second power supply and the second power supply nodes of the second inverters during the write of the logic state to the one or more of the first storage nodes;
    third circuitry to increase a resistance between the first power supply and the first power supply nodes of the second inverters during a write of the logic state to one or more of the second storage nodes; and
    fourth circuitry to increase a resistance between the second power supply and the second power supply nodes of the first inverters during the write of the logic state to the one or more of the second storage nodes.

8. The system of claim 7, wherein the first, second, third, and fourth circuitry each include:
- a first resistor coupled between the corresponding power supply node and an output;
- a first switch circuit to couple the corresponding power supply node to the output in response to an inactive write enable state at the control input; and
- a second switch circuit to couple the corresponding power supply node to the output in response to the logic state.

9. The system of claim 1, wherein the control circuit includes circuitry to weaken state-retention strengths of the plurality of memory cells during active clock cycles of write operations.

10. A system comprising:
- an array of memory cells configured as a plurality of bit slices, each bit slice including a plurality of the memory cells and a corresponding common data input; and
- a plurality of control circuits, each corresponding to one of the plurality of bit slices, to weaken state-retention strengths of the corresponding plurality of memory cells during a write operation to a subset of the corresponding plurality of memory cells, and to preserve state-retention abilities of remaining ones of the corresponding plurality of memory cells during the write operation.

11. The system of claim 10, wherein each of the memory cells includes first and second opposite-sense storage nodes to store corresponding opposite-sense logic states, and first and second inverters opposingly coupled between the first and second opposite-sense storage nodes, and wherein each of the control circuits include:
- first circuitry to weaken state retention strengths of the first inverters of the corresponding plurality of memory cells during a write of a logic state to one or more of the first storage nodes, in response to the logic state; and
- second circuitry to weaken state retention strengths of the second inverters of the corresponding plurality of memory cells during a write of the logic state to one or more of the second storage nodes, in response to the logic state.

12. The system of claim 11, wherein:
- the first circuitry includes circuitry to increase a resistance between a power supply and the first inverters of the corresponding plurality of memory cells during a write of the logic state to the one or more first storage nodes of the corresponding plurality of memory cells; and
- the second circuitry includes circuitry to increase a resistance between the power supply and the second inverters of the corresponding plurality of memory cells during a write of the logic state to the one or more second storage nodes of the corresponding plurality of memory cells.

13. The system of claim 12, wherein each of the control circuits include a power supply node, the common data input, an inverted data input, a control input, a first output node coupled to the first inverter circuits of the plurality of memory cells, and a second output node coupled to the second inverter circuits of the plurality of memory cells, and wherein:
- the first circuitry includes,
  - a first resistor coupled between the power supply node and the first output node,
  - a first switch circuit to couple the power supply node to the first output node in response to an inactive write enable state at the control input, and
  - a second switch circuit to couple the power supply node to the first output node in response to the logic state at one of the common data input and the inverted data input; and
- the second circuitry includes,
  - a second resistor coupled between the power supply node and the second output node,
  - a third switch circuit to couple the power supply node to the second output node in response to an inactive write enable state at the control input, and
  - a fourth switch circuit to couple the power supply node to the second output node in response to the logic state at the other one of the common data input and the inverted data input.

14. The system of claim 10, wherein each of the plurality of memory cells includes first and second opposite-sense storage nodes to store corresponding opposite-sense logic states, and first and second inverters opposingly coupled between the first and second opposite-sense storage nodes, wherein each of the inverters includes first and second power supply nodes, and wherein each of the control circuits include:
- first circuitry to increase a resistance between a first power supply and the first power supply nodes of the first inverters of the corresponding plurality of memory cells during a write of a logic state to one or more of the first storage nodes of the corresponding plurality of memory cells;
- second circuitry to increase a resistance between a second power supply and the second power supply nodes of the second inverters of the corresponding plurality of memory cells during the write of the logic state to the one or more of the first storage nodes of the corresponding plurality of memory cells;
- third circuitry to increase a resistance between the first power supply and the first power supply nodes of the second inverters of the corresponding plurality of memory cells during a write of the logic state to one or more of the second storage nodes of the corresponding plurality of memory cells; and
- fourth circuitry to increase a resistance between the second power supply and the second power supply nodes of the first inverters of the corresponding plurality of memory cells during the write of the logic state to the one or more of the second storage nodes of the corresponding plurality of memory cells.

15. The system of claim 14, wherein the first, second, third, and fourth circuitry each include:
- a first resistor coupled between the corresponding power supply node and an output;
- a first switch circuit to couple the corresponding power supply node to the output in response to an inactive write enable state at the control input; and
- a second switch circuit to couple the corresponding power supply node to the output in response to the logic state.

16. A method, comprising:
- writing a data input logic state to a subset of a plurality of memory cells; and
- weakening state-retention strengths of the plurality of memory cells during the writing and preserving state-retention abilities of remaining ones of the plurality of memory cells.

17. The method of claim 16, wherein each of the plurality of memory cells includes first and second opposite-sense storage nodes to store corresponding opposite-sense logic states, and first and second inverters opposingly coupled between the first and second opposite-sense storage nodes, and wherein the weakening state-retention strengths includes:
- weakening state retention strengths of the first inverters of the plurality of memory cells during a write of a logic state to one or more of the first storage nodes, in response to the logic state; and weakening state retention strengths of the second inverters of the plurality of memory cells during a write of the logic state to one or more of the second storage nodes, in response to the logic state.

18. The method of claim 16, wherein each of the plurality of memory cells includes first and second opposite-sense storage nodes to store corresponding opposite-sense logic states, and first and second inverters opposingly coupled between the first and second opposite-sense storage nodes, wherein each of the inverters includes a power supply node, and wherein the weakening state-retention strengths includes:
    increasing a resistance between a power supply and the power supply nodes of the first inverters during a write of a logic state to one or more of the first storage nodes, and
    increasing a resistance between the power supply and the power supply nodes of the second inverters during a write of the logic state to one or more of the second storage nodes.

19. The method of claim 16, wherein each of the plurality of memory cells includes first and second opposite-sense storage nodes to store corresponding opposite-sense logic states, and first and second inverters opposingly coupled between the first and second opposite-sense storage nodes, wherein each of the inverters includes first and second power supply nodes, and wherein the weakening state-retention strengths includes:
    increasing a resistance between a first power supply and the first power supply nodes of the first inverters during a write of a logic state to one or more of the first storage nodes;
    increasing a resistance between a second power supply and the second power supply nodes of the second inverters during the write of the logic state to one or more of the first storage nodes;
    increasing a resistance between the first power supply and the first power supply nodes of the second inverters during a write of the logic state to one or more of the second storage nodes; and
    increasing a resistance between the second power supply and the second power supply nodes of the first inverters during the write of the logic state to the one or more of the second storage nodes.

20. The method of claim 16, wherein the weakening state-retention strengths includes weakening the state-retention strengths during active clock cycles of write operations.

* * * * *